US010768018B2

(12) United States Patent
Astley

(10) Patent No.: US 10,768,018 B2
(45) Date of Patent: Sep. 8, 2020

(54) SENSING APPARATUS HAVING SWITCH RESISTANCE COMPENSATION CIRCUIT AND ASSOCIATED METHODS

(71) Applicant: Nokia Technologies Oy, Espoo (FI)

(72) Inventor: Michael Astley, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 147 days.

(21) Appl. No.: 15/778,390

(22) PCT Filed: Nov. 21, 2016

(86) PCT No.: PCT/FI2016/050815
§ 371 (c)(1),
(2) Date: May 23, 2018

(87) PCT Pub. No.: WO2017/093602
PCT Pub. Date: Jun. 8, 2017

(65) Prior Publication Data
US 2018/0348014 A1      Dec. 6, 2018

(30) Foreign Application Priority Data

Nov. 30, 2015  (EP) ..................................... 15197081

(51) Int. Cl.
*G01D 5/16* (2006.01)
*G01R 33/00* (2006.01)
(Continued)

(52) U.S. Cl.
CPC .................. *G01D 5/16* (2013.01); *G01J 1/44* (2013.01); *G01J 5/20* (2013.01); *G01J 5/22* (2013.01);
(Continued)

(58) Field of Classification Search
CPC ...... G01D 5/16; G01R 33/0041; G01R 33/09; G11C 13/003; G11C 13/004;
(Continued)

(56) References Cited

U.S. PATENT DOCUMENTS 6,359,460 B1 *  3/2002  Tanaka .................. G01D 3/036
324/756.06
6,633,246 B1   10/2003  Bowers
(Continued)

FOREIGN PATENT DOCUMENTS

EP      2075913 A2      7/2009
EP      2096621 A2      9/2009
(Continued)

OTHER PUBLICATIONS

Dyck et al., "Integrated Arrays of Silicon Photodetectors for Image Sensing", IEEE Transactions on Electron Devices, vol. 15, No. 4, Apr. 1968, pp. 196-201.
(Continued)

*Primary Examiner* — Tung X Nguyen
*Assistant Examiner* — Feba Pothen
(74) *Attorney, Agent, or Firm* — Harrington & Smith

(57) ABSTRACT

An apparatus comprising: a passive array (202) of resistive elements (250); a row selector switch (204) and a column selector switch (206) configured to respectively connect a particular row and a particular column of resistive elements to ground; and a feedback column selector switch (208) configured to connect all columns of resistive elements to a voltage source, except for the particular column connected to ground by the column selector switch; the voltage source configured to apply a voltage to the columns of resistive elements, the voltage matching a voltage dropped over the resistive element connected in circuit by the row and column selector switches; and further comprising: a row selector
(Continued)

switch compensation circuit (220), a column selector switch compensation circuit (240) and/or a feedback column selector switch compensation circuit (260) each configured to apply a voltage across a corresponding dummy element equal and opposite to a voltage dropped over the corresponding selector switch.

19 Claims, 10 Drawing Sheets

(51) Int. Cl.
G01J 5/22 (2006.01)
G01J 1/44 (2006.01)
G01J 5/20 (2006.01)
G11C 7/14 (2006.01)
G01R 33/09 (2006.01)
G11C 13/00 (2006.01)
G06F 3/045 (2006.01)
H04N 5/33 (2006.01)
H03K 17/96 (2006.01)

(52) U.S. Cl.
CPC ......... *G01R 33/0041* (2013.01); *G01R 33/09* (2013.01); *G06F 3/045* (2013.01); *G11C 7/14* (2013.01); *G11C 13/003* (2013.01); *G11C 13/004* (2013.01); *G11C 13/0023* (2013.01); *G11C 13/0033* (2013.01); *H03K 17/9643* (2013.01); *H04N 5/33* (2013.01); *G01J 2005/202* (2013.01); *G11C 2213/77* (2013.01)

(58) Field of Classification Search
CPC ... G11C 13/0023; G11C 13/0033; G11C 7/14; G11C 2213/77; G01J 5/22; G01J 1/44; G01J 5/20; G01J 2005/202; G06F 3/045; H04N 5/33; H03K 17/9643
See application file for complete search history.

(56) References Cited

U.S. PATENT DOCUMENTS

| 7,336,211 | B1* | 2/2008 | Lai .......................... H03M 1/06 341/118 |
| 7,679,048 | B1 | 3/2010 | Aziz et al. |
| 2006/0065048 | A1 | 3/2006 | Brouillette |
| 2010/0277399 | A1* | 11/2010 | Yu ......................... G09G 3/3655 345/58 |
| 2012/0217380 | A1 | 8/2012 | Sakakibara |
| 2012/0293560 | A1* | 11/2012 | Li ......................... G09G 3/3607 345/690 |
| 2013/0223134 | A1 | 8/2013 | Yi et al. |
| 2014/0103471 | A1 | 4/2014 | Lupino et al. |

FOREIGN PATENT DOCUMENTS

| WO | 02/069340 A1 | 9/2002 |
| WO | 2006/083347 A2 | 8/2006 |

OTHER PUBLICATIONS

Lin et al., "A Four Transistor CMOS Active Pixel Sensor With High Dynamic Range Operation", IEEE Asia-Pacific Conference on Advanced System Integrated Circuits, Aug. 4-5, 2004, pp. 124-127.

Yang et al., "An Integrated Flexible Temperature and Tactile Sensing Array Using PI-Copper Films", Sensors and Actuators A: Physical, vol. 143, No. 1, May 2, 2008, pp. 143-153.

Saxena et al., "Virtual Ground Technique for Crosstalk Suppression in Networked Resistive Sensors", IEEE Sensors Journal, vol. 11, No. 2, Feb. 2011, pp. 432-433.

Tise, "A Compact High Resolution Piezoresistive Digital Tactile Sensor", IEEE International Conference on Robotics and Automation, vol. 2, Apr. 24-29, 1988, pp. 760-764.

Wu et al., "A Novel Crosstalk Suppression Method of the 2-D Networked Resistive Sensor Array", Sensors, vol. 14, No. 7, Jul. 2014, pp. 12816-12827.

Wu et al., "Design and Crosstalk Error Analysis of the Circuit for the 2-D Networked Resistive Sensor Array", IEEE Sensors Journal, vol. 15, No. 2, Feb. 2015, pp. 1020-1026.

Extended European Search Report received for corresponding European Patent Application No. 15197081.1, dated May 17, 2016, 9 pages.

International Search Report and Written Opinion received for corresponding Patent Cooperation Treaty Application No. PCT/FI2016/050815, dated Feb. 13, 2017, 14 pages.

* cited by examiner

Using an apparatus to detect a sensing event at a particular resistive element in a passive array of an apparatus,
the apparatus comprising:
- a row selector switch configured to connect a current source to a particular row of resistive elements of the passive array;
- a column selector switch configured to connect a particular column of resistive elements of the passive array to ground; and
- a feedback column selector switch configured connect all columns of resistive elements to a voltage source, except for the particular column connected to ground by the column selector switch; the voltage source configured to apply a voltage to the columns of resistive elements connected to the voltage source, the voltage matching a voltage dropped over the resistive element connected in circuit by the row selector switch and column selector switch;

and further comprising one or more of:
- a row selector switch compensation circuit configured to apply a voltage across a row dummy element equal and opposite to a voltage dropped over the row selector switch;
- a column selector switch compensation circuit configured to apply a voltage across a column dummy element equal and opposite to a voltage dropped over the column selector switch; and
- a feedback column selector switch compensation circuit configured to apply a voltage across a feedback column dummy element equal and opposite to a voltage dropped over the feedback column selector switch.

Figure 8

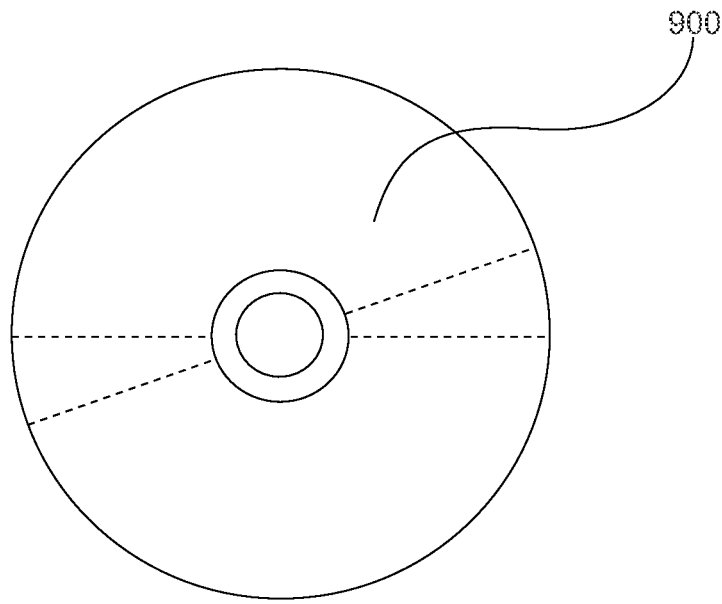

Figure 9

SENSING APPARATUS HAVING SWITCH RESISTANCE COMPENSATION CIRCUIT AND ASSOCIATED METHODS

RELATED APPLICATION

This application was originally filed as PCT Application No. PCT/FI2016/050815 filed Nov. 21, 2016 which claims priority benefit from EP Application No. 15197081.1 filed Nov. 30, 2015.

TECHNICAL FIELD

The present disclosure relates to the field of electronics, and in particular electronic sensors/apparatus. Some embodiments may relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

BACKGROUND

The present disclosure relates to electronics, and in particular electronic sensors and sensor arrays.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising:
  a passive array of resistive elements;
  a row selector switch configured to connect a current source to a particular row of resistive elements of the passive array;
  a column selector switch configured to connect a particular column of resistive elements of the passive array to ground; and
  a feedback column selector switch configured to connect all columns of resistive elements to a voltage source, except for the particular column connected to ground by the column selector switch; the voltage source configured to apply a voltage to the columns of resistive elements connected to the voltage source, the voltage matching a voltage dropped over the resistive element connected in circuit by the row selector switch and column selector switch;
  and further comprising one or more of:
    a row selector switch compensation circuit configured to apply a voltage across a row dummy element equal and opposite to a voltage dropped over the row selector switch;
    a column selector switch compensation circuit configured to apply a voltage across a column dummy element equal and opposite to a voltage dropped over the column selector switch; and
    a feedback column selector switch compensation circuit configured to apply a voltage across a feedback column dummy element equal and opposite to a voltage dropped over the feedback column selector switch.

The apparatus may comprise each of the row selector switch compensation circuit, the column selector switch compensation circuit and the feedback column selector switch compensation circuit.

The dummy element in one or more of the row selector switch compensation circuit, the column selector switch compensation circuit and the feedback column selector switch compensation circuit may be a dummy switch configured to have comparable physical properties to the corresponding selector switch.

The apparatus may comprise a current source configured to provide a current to the circuit. The row selector switch compensation circuit may comprise a current sink configured to provide an equal and opposite current to the current source.

The column selector switch compensation circuit may comprise an operational amplifier configured to apply a voltage across the column dummy element according to the current passing through the particular column connected to ground.

The column selector switch compensation circuit may comprise a first resistor connected in parallel with the operational amplifier; and a second resistor connected between an input terminal of the operational amplifier and ground; wherein the ratio of the resistance of the first resistor to the resistance of the second resistor is one.

The feedback column selector switch compensation circuit may comprise an operational amplifier configured to apply a voltage across the feedback column dummy element according to the average current passing through all the columns of resistive elements connected to the voltage source except for the particular column connected to ground by the column selector switch.

The feedback column selector switch compensation circuit may comprise a resistor connected in parallel with the operational amplifier; and a second resistor connected to an input terminal of the operational amplifier; wherein the ratio of the resistance of the first resistor to the resistance of the second resistor corresponds to the number of columns of resistive elements minus one.

The passive array of resistive elements may comprise one or more of: a sensor; a photodetector; an X-ray detector; a memristor; a piezoresistive (pressure/strain) sensor; a magneto-resistive sensor; a resistive temperature sensor (thermistor); a light dependent sensor; a resistive level sensor; a field-effect-transistor based sensor; a graphene-based sensor; a chemical sensor, and a biosensor.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, an x-ray sensor, and a module for one or more of the same.

According to a further aspect, there is provided a method comprising using an apparatus to detect a sensing event at a particular resistive element in a passive array of an apparatus, the apparatus comprising:
  a row selector switch configured to connect a current source to a particular row of resistive elements of the passive array;
  a column selector switch configured to connect a particular column of resistive elements of the passive array to ground; and
  a feedback column selector switch configured to connect all columns of resistive elements to a voltage source, except for the particular column connected to ground by the column selector switch; the voltage source configured to apply a voltage to the columns of resistive elements connected to the voltage source, the voltage matching a voltage dropped over the resistive element connected in circuit by the row selector switch and column selector switch;

and further comprising one or more of:
  a row selector switch compensation circuit configured to apply a voltage across a row dummy element equal and opposite to a voltage dropped over the row selector switch;
  a column selector switch compensation circuit configured to apply a voltage across a column dummy element equal and opposite to a voltage dropped over the column selector switch; and
  a feedback column selector switch compensation circuit configured to apply a voltage across a feedback column dummy element equal and opposite to a voltage dropped over the feedback column selector switch.

The steps of any method described herein may be performed in any order to as to carry out the inventive function as understood by the skilled person.

According to a further aspect, there is provided a computer readable medium comprising computer program code stored thereon, the computer readable medium and computer program code being configured to, when run on at least one processor, control the operation of an apparatus, the apparatus comprising:
  a passive array of resistive elements;
  a row selector switch configured to connect a current source to a particular row of resistive elements of the passive array;
  a column selector switch configured to connect a particular column of resistive elements of the passive array to ground; and
  a feedback column selector switch configured to connect all columns of resistive elements to a voltage source, except for the particular column connected to ground by the column selector switch; the voltage source configured to apply a voltage to the columns of resistive elements connected to the voltage source, the voltage matching a voltage dropped over the resistive element connected in circuit by the row selector switch and column selector switch;

and further comprising one or more of:
  a row selector switch compensation circuit configured to apply a voltage across a row dummy element equal and opposite to a voltage dropped over the row selector switch;
  a column selector switch compensation circuit configured to apply a voltage across a column dummy element equal and opposite to a voltage dropped over the column selector switch; and
  a feedback column selector switch compensation circuit configured to apply a voltage across a feedback column dummy element equal and opposite to a voltage dropped over the feedback column selector switch;

the control providing for:
  detecting a sensing event at a particular resistive element in the passive array by switching the one or more of the row selector switch compensation circuit, the column selector switch compensation circuit and the feedback column selector switch compensation circuit.

Corresponding computer programs (which may or may not be recorded on a carrier) for implementing one or more of the methods disclosed herein are also within the present disclosure and encompassed by one or more of the described example embodiments.

The present disclosure includes one or more corresponding aspects, example embodiments or features in isolation or in various combinations whether or not specifically stated (including claimed) in that combination or in isolation. Corresponding means and functional units for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 8 illustrates a method according to examples described herein; and

FIG. 9 shows a computer-readable medium comprising a computer program configured to control an apparatus as described herein according to the method of FIG. 8.

DESCRIPTION OF SPECIFIC ASPECTS/EMBODIMENTS

Figure 1:
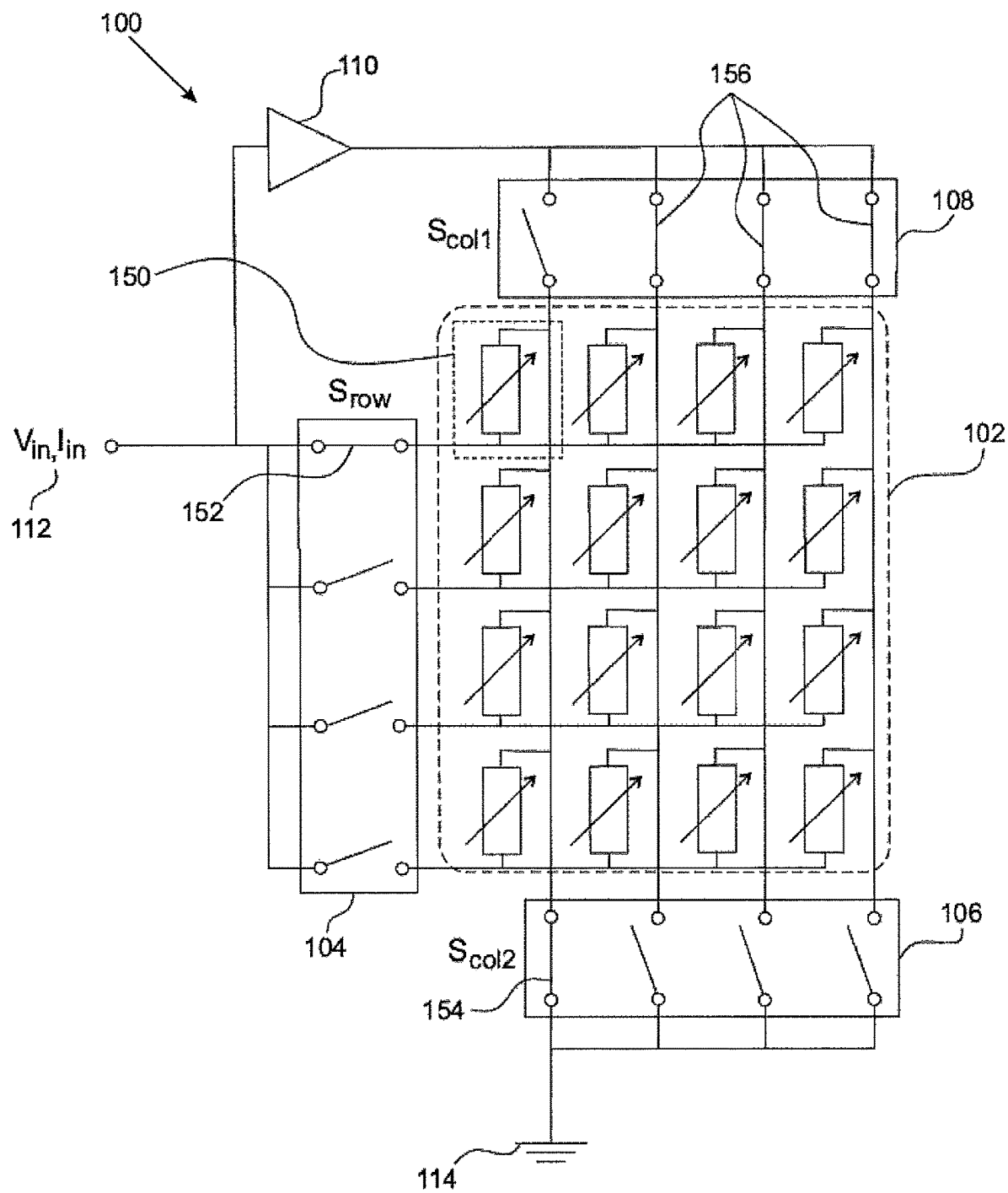
FIG. 1 illustrates a passive array with a voltage feedback circuit.

Resistive sensors may be used to measure a wide variety of stimuli, such as light, temperature, strain, humidity, chemicals, magnetic fields etc. In particular, field-effect-transistor (FET) based sensors show promise as photodetectors (optoFETs), chemical sensors (chemFETs) and biochemical sensors (bioFETs). Sensor arrays, combining large numbers of individual sensors, are particularly useful as they can enable applications such as imaging, or combining large numbers of sensor readings in e.g. an electronic nose.

One area that shows strong promise is for large-area optoFET arrays that could be used for imaging, especially if they can be integrated with scintillators for x-ray imaging. However, this requires a way of reading a large area resistive sensor array in an accurate yet cost-efficient manner.

Some existing sensor arrays are active matrix arrays, meaning that each pixel contains an active element such as an amplifier or one or more transistors to switch the sensor connections. Large-area active matrix arrays can be made using thin-film transistors (TFTs). Using such active arrays can allow each sensor in the array to be read individually. However, this approach introduces expense into the manufacturing costs of the array, limits the choice of materials for the sensor backplane, and may limit the materials that can be used for the sensors (as chemicals, temperatures etc. used to deposit the sensors may degrade the TFTs). This technology is relatively complex, expensive, and the series resistance of the switching transistor creates errors in the sensor reading.

Sensor arrays can be made with connections to every single pixel, in which an M×N pixel array requires MN sensor connections. Such an approach can be used for a few pixels, but is impractical for larger arrays: Thus a matrix arrangement, with only M+N pixel connections may be preferable.

An alternative is to use a passive sensor array and use voltage feedback to prevent crosstalk between neighbouring sensors. A passive sensor array is an array of sensors without their own dedicated active element such as an amplifier or transistor. While in a simple assessment this technique appears promising, in real-world use the finite resistance of the column and row switches create measurement inaccuracies due, for example, to cross talk between neighbouring sensors, which have prevented this technique becoming widespread.

Cross talk may be reduced by using a virtual ground method, which reduces the potential difference between sensor columns by attaching each column to the virtual ground of a transimpedance amplifier. However, this approach has the disadvantage that it is reliant on a large number of amplifiers, which all must have excellent characteristics if they are not to introduce additional measurement errors; thus the readout circuit can become large and expensive.

Cross talk may be reduced by a voltage feedback method, where the voltage read from the measured sensor is applied to all other sensors in a row/column, reducing the potential difference across unread sensors. While the voltage feedback method works well in principle, requiring only a few additional components, in real-world use it is strongly constrained by the need for the column/row selection switches to be of much lower resistance than the sensors; otherwise the isolation from cross talk is greatly reduced.

Compensating for the switch resistance by either adjusting the feedback voltage or by measuring a voltage drop across an external resistor and calculating a correction factor for the reading may improve matters, but adjusting the feedback in a single step can only account for a single switch resistance, and so will not fully compensate the array. Further, measuring the voltage drop requires an additional analog-to-digital conversion for every sensor reading (slowing the measurement down) and then requires additional computationally expensive corrections. Thus there is a need to improve upon these methods.

Examples disclosed herein may provide an improved version of the voltage feedback method that uses additional circuitry featuring amplifiers and dummy switches as part of the feedback network to automatically compensate the feedback voltage and the sensor readings. The overall effect is to create voltage level shifts at the sensor array connections that have been matched to the voltage drops caused by column and row switch resistances, thus reducing the problems described above, for example due to cross talk. The resulting circuits could be used to read large arrays of sensors with high accuracy yet very simple sensor selection circuitry. Thus examples disclosed herein may be considered to systematically compensate for all the switch resistances in a passive sensor array.

Using apparatus and techniques described herein, passive resistive sensor networks can be made practically useful for large-area sensor arrays. In particular, use of apparatus discussed herein for low-cost, large-area flat panel arrays for x-ray detection is an attractive possibility.

FIG. 1 illustrates a passive array with a voltage feedback circuit. This is an example of an uncompensated voltage feedback circuit.

FIG. 1 shows a passive array of resistive elements 102. A row selector switch 104 is connected to the rows of sensors, and is configured to connect a current source 112 to a particular row of resistive elements of the passive array 102. In this case, the top row containing the sensor 150 is switched into the measurement circuit by the row switch 152. A column selector switch 106 is configured to connect a particular column of resistive elements of the passive array 102 to ground 114. In this case, the left most column containing the sensor 150 is switched into the measurement circuit by the column switch 154.

There is also a feedback column selector switch 108 which may be considered as part of the voltage feedback circuitry. This feedback column selector switch 108 is configured to connect all columns of resistive elements to a voltage source 110 except for the particular column (here, the left-most column) connected to ground 114 by the column selector switch 106 (in this case, the feedback column selector switch 108 connects the three right-most rows connected into the feedback circuit by switches 156). The voltage source 110 is configured to apply a voltage to the columns of resistive elements 102 connected to the voltage source 110. The voltage applied by the voltage source 110 should match a voltage dropped over the resistive element 150 connected in circuit by the row switch 152 of the row selector switch 104 and the column switch 154 of the column selector switch 106.

A known current $I_{in}$ 112 is applied to the sensor panel 100 and a measurement of the input voltage $V_{in}$ is used to find the sensor 150 resistance $R=V_{in}/I_{in}$. The sensor voltage is fed back to the unread sensor columns using the voltage buffer 110 in order to reduce currents flowing through sensors parallel to the measured device 150, reducing cross-talk to improve the sensor measurement.

However, as mentioned above, this uncompensated voltage feedback method does not systematically compensate for all sources of sensor cross talk. If the switches 104, 106, 108 have finite resistance, the following three voltage drops need to be compensated:

1. The voltage drop due to the measurement current ($I_{in}$) 112 flowing through the row selector switch ($S_{row}$) 104 (in this example, through the closed row switch 152);
2. The voltage drop due to the feedback current flowing through the feedback column selector switch ($S_{col1}$) 108 (in this example, the three closed switches 156); and
3. The voltage drop due to the current flowing through the column selector switch ($S_{col2}$) 106 to ground 114 (in this example, through the closed column switch 154).

Figure 2:
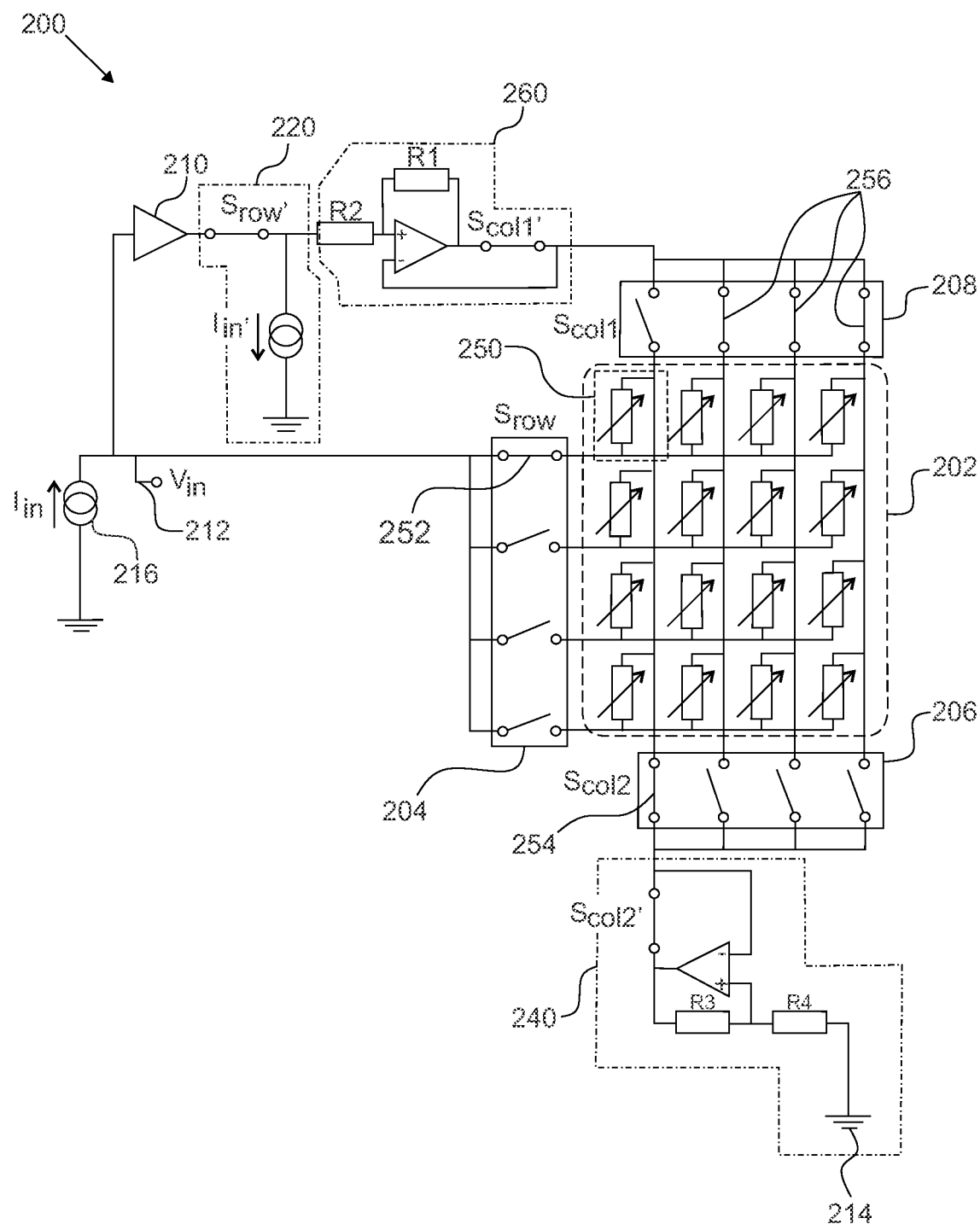
FIG. 2 illustrates a compensated passive array with a voltage feedback circuit according the examples disclosed herein.

FIG. 2 illustrates an example apparatus 200 with systematic compensation for these three sources of cross-talk. Elements in common with FIG. 1 are given corresponding reference numerals and are not discussed again in detail here.

FIG. 2 illustrates what may be termed a "compensated passive array with a voltage feedback circuit". The circuit 200 uses dummy switches $S_{row}'$, $S_{col1}'$ and $S_{col2}'$ which have the same series resistances as the corresponding row selector switch 204, column selector switch 206, and feedback column selector switch 208, to reduce the effect of voltages dropped over these switches. Dummy switch $S_{row}'$ forms part of the row selector switch compensation circuit 220.

Dummy switch $S_{col2}'$ forms part of the column selector switch compensation circuit 240. Dummy switch $S_{col1}'$ forms part of the feedback column selector switch compensation circuit 260.

That is, the apparatus of FIG. 2 comprises, further to the apparatus of FIG. 1:
  a row selector switch compensation circuit 220 configured to apply a voltage across a row dummy element $S_{row}'$ equal and opposite to a voltage dropped over the row switch 252 of the row selector switch 204;
  a column selector switch compensation circuit 240 configured to apply a voltage across a column dummy element $S_{col2}'$ equal and opposite to a voltage dropped over the column switch 254 of the column selector switch 206; and
  a feedback column selector switch compensation circuit 260 configured to apply a voltage across a feedback column dummy element $S_{col1}'$ equal and opposite to a voltage dropped over the feedback column switches 256 of the feedback column selector switch 208.

In the example of FIG. 2, the apparatus comprises the row selector switch compensation circuit 220, the column selector switch compensation circuit 240 and the feedback column selector switch compensation circuit 260. In other examples, the circuit may contain only one or only two of the three abovementioned compensation circuits 220, 240, 260.

In FIG. 2, the dummy elements $S_{row}'$, $S_{col1}'$ and $S_{col2}'$ in each selector switch compensation circuit 220, 240, 260 is a dummy switch $S_{row}'$, $S_{col1}'$ and $S_{col2}'$ configured to have comparable physical properties to the corresponding selector switch 252, 254, 256. That is, the dummy element is a replica of the switch used to switch the required sensor into the circuit for measurement and voltage feedback, in order to closely mimic the physical properties of the switch for which a voltage drop over that switch is to be compensated by an equal and opposite voltage drop over the corresponding dummy element. Of course, the dummy element may be any physical element which provides substantially the same physical properties as the switch to be compensated. Such physical properties to consider include electrical and thermal properties, for example. It may be advantageous for the dummy switch to be an unused switch from the same chip/die as used for the row/column selectors, ensuring excellent thermal/environmental matching.

The passive array of resistive elements 102, 202 in FIGS. 1 and 2 are shown simply as variable resistors (that is, their resistance will vary depending on their current state, i.e. whether they are sensing or not, and to what degree). The resistive elements 102, 202 may comprise, for example, photodetectors; X-ray detectors; memristors; piezoresistive (pressure/strain) sensors; magneto-resistive sensors; resistive temperature sensors (thermistors); light dependent sensors; resistive level sensors; field-effect-transistor based sensors; graphene-based sensors; chemical sensors, and/or a biosensors, for example.

Figure 3A:
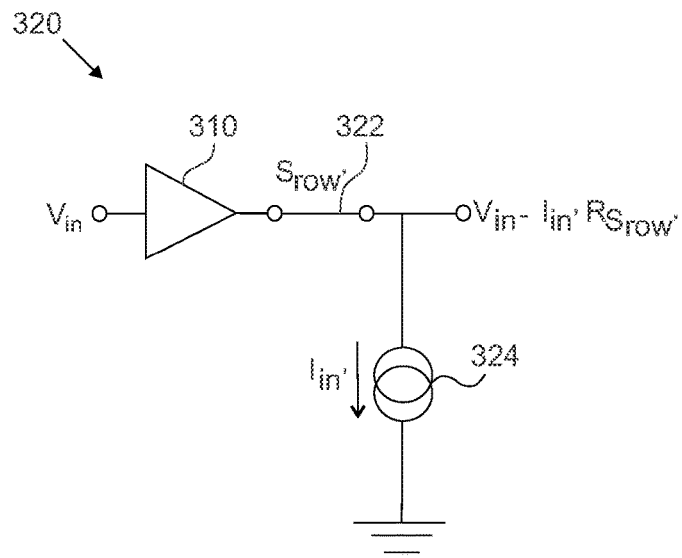
FIGS. 3a-c illustrate different compensation circuits for a voltage feedback circuit according to examples disclosed herein.
Figure 3B:
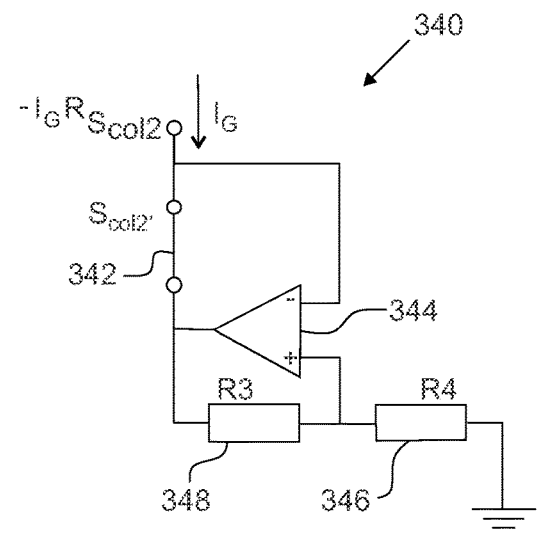
Figure 3C:
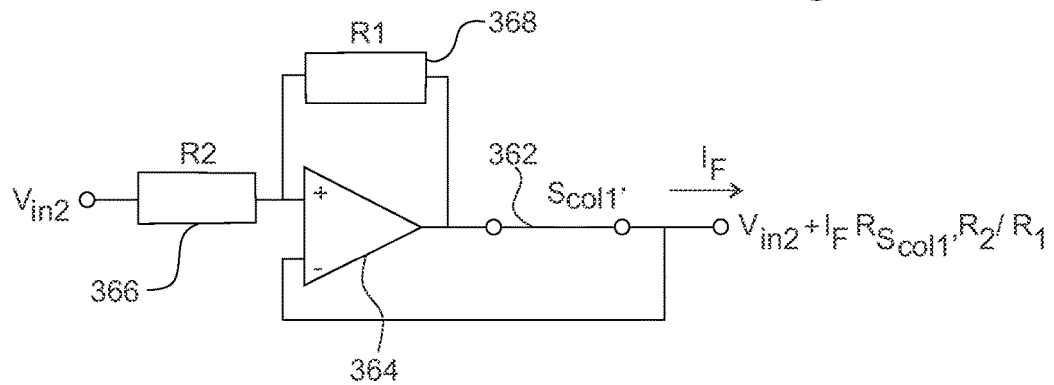

FIGS. 3a-c illustrate different compensation circuits (FIG. 3a shows a row selector switch compensation circuit 320; FIG. 3b shows a column selector switch compensation circuit 340 and FIG. 3c shows a feedback column selector switch compensation circuit 360) for a voltage feedback circuit 200 according to examples disclosed herein.

FIG. 3a shows a row selector switch compensation circuit 320 to compensate for a voltage dropped over a row selector switch $S_{row}$. The circuit 320 comprises a current sink 324 configured to provide an equal and opposite current to the current source supplying the circuit (e.g. circuit 200) with current. Also shown is the voltage buffer/source 310 of the voltage feedback loop as in FIGS. 1 and 2. The dummy element $S_{row}'$ 322 is a switch with substantially the same physical properties as the row selector switch over which a voltage is dropped and is to be compensated for by this circuit 320.

Ignoring negligible leakage currents, the current $I_{in}$ flows entirely through the row selector switch of the circuit 200 $S_{row}$, which has a resistance $R_{S_{row}}$. The row bias voltage is therefore at a voltage $\Delta V = I_{in} R_{S_{row}}$ below $V_{in}$. The feedback voltage buffered from $V_{in}$ by the voltage buffer 310 must therefore be lowered by the same amount. As $I_{in}$ is taken from a known current source (source 216 in FIG. 2), a "mirror-image" current sink 324 of the same size is used in the compensation circuit 320. This current $I_{in}'$ is applied across the dummy switch $S_{row}'$ 322 to produce the correct shift for the feedback voltage and compensate for a voltage dropped over the row selector switch.

FIG. 3b shows a column selector switch compensation circuit 340 to compensate for a voltage dropped over a column selector switch $S_{col2}$. The circuit 340 comprises an operational amplifier 344 configured to apply a voltage across the column dummy element $S_{col2}'$ 342 according to the current passing through the particular column connected to ground. In this example, the column selector switch compensation circuit 340 also comprises a first resistor $R_3$ 348 connected in parallel with the operational amplifier 344, and a second resistor $R_4$ 346 connected between an input terminal of the operational amplifier 344 and ground. The ratio of the resistance of the first resistor $R_3$ 348 to the resistance of the second resistor $R_4$ 346 is one/unity.

In operation, the column selector switch (e.g., switch 254 of FIG. 2) connects the column of the measured sensor (e.g., element 250 of FIG. 2) to ground. The total current flowing into the sensor array must go through this switch $S_{col2}'$ 254, meaning that sensor changes in the circuit/feedback network will change the switch current and thus any voltage offset associated with the switch resistance, leading to cross talk. To ensure that the column is at ground, if the current through the switch 254 is $I_G$ the voltage outside of the switch must be biased to $V=-I_G R_{S_{col2}}$ to compensate. This can be achieved using the circuit of FIG. 3b with $R_3=R_4$.

FIG. 3c shows a feedback column selector switch compensation circuit 360 to compensate for a voltage dropped over a feedback column selector switch $S_{col1}$. The feedback column selector switch compensation circuit 360 in this example comprises an operational amplifier 364 configured to apply a voltage across a feedback column dummy element $S_{col1}'$ 362 according to the average current passing through all the columns of resistive elements (connected in by the switches 256 in FIG. 2) connected to the voltage source (source 210 in FIG. 2) except for the particular column connected to ground by the column selector switch $S_{col2}$.

In this example, the feedback column selector switch compensation circuit 360 also comprises a first resistor $R_1$ 368 connected in parallel with the operational amplifier 364 and a second resistor $R_2$ 366 connected to an input terminal of the operational amplifier 366; wherein the ratio of the resistance of the first resistor $R_1$ 368 to the resistance of the second resistor $R_2$ 366 corresponds to the number of columns of resistive elements minus one. That is, for the circuit of FIG. 2, the ratio of the resistance of the first resistor $R_1$ 368 to the resistance of the second resistor $R_2$ 366 would be three, because there are four columns of resistive elements (four minus one is three). The ratio is the number of columns of resistive elements minus one, because in the feedback circuit, all columns of resistive elements/sensors are connected into the feedback circuit, less one column of resistive elements/sensors which is connected in for measurement.

In operation, a current flows through each of the connected feedback switches (e.g., switches 256 in FIG. 2) to provide the voltage feedback to the measurement circuit. The exact size of this current will depend on the sensor values, and so is not known in advance, but it can be determined from the current $I_F$ flowing out of the feedback amplifier 210. Each switch 256 may have a different current flowing through it, so in some examples there may be a separate compensation circuit for each switch. However, for a simpler solution, requiring fewer electronic components, it is more straightforward to assume that the feedback current $I_F$ is equally shared between the switches 256, so for an N column array there is an average current of $I_F/(N-1)$ flowing through each of the N-1 feedback switches connected (the switch going to the measured sensor column is left open in the feedback column selector switch). The feedback voltage in the array is therefore reduced by $\Delta V = I_F R_{S_{coll}}/(N-1)$, so an equivalent voltage shift in the feedback voltage amplifier 210 is required. The circuit of FIG. 3c can be used to apply an appropriate voltage shift to compensate for the voltage dropped over the feedback switch 256, where the resistor ratio is chosen as $$\frac{R_1}{R_2} = N - 1.$$

FIGS. 4a-c, 5a-b, 6a-b and 7a-b illustrate simulations of the operation of a 10×10 element sensor array circuit. The simulations were performed using the LTSPICE modelling software. 10×10 sensor arrays have been simulated using realistic components. The sensors and switches are treated simply as resistors. In all simulations the measured sensor (R) is held at 1 kΩ and the all the other sensors (R_xx) are swept from 100Ω to 10 kΩ (along the x-axis) to simulate an extreme worst-case scenario for sensor cross-talk. The sensor reading as measured by the circuit (along the y-axis) is labelled as 450, 550, 650 and 750 in the corresponding figures, while the true sensor value is labelled as 460, 560, 660 and 780 and is shown by a flat trace at 1 kΩ resistance on the y-axis.

A 100 μA drive current is produced by a PNP transistor current source. The feedback amplifiers use LTC2055 operational amplifiers which have been selected for their extremely low input bias currents and voltage offsets. Because these are precision components, additional bipolar transistor output stages have been added to ensure that these amplifiers are able to provide plenty of current to bias the sensor arrays.

Figure 4A:
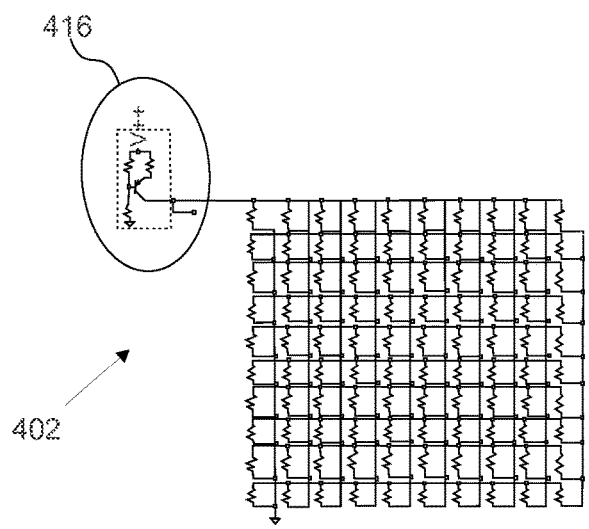
FIGS. 4a-c illustrate a simulation of the operation of a sensor array circuit.
Figure 4B:
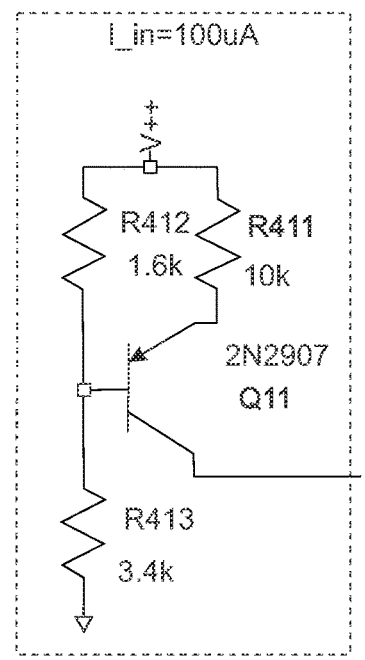
Figure 4C:
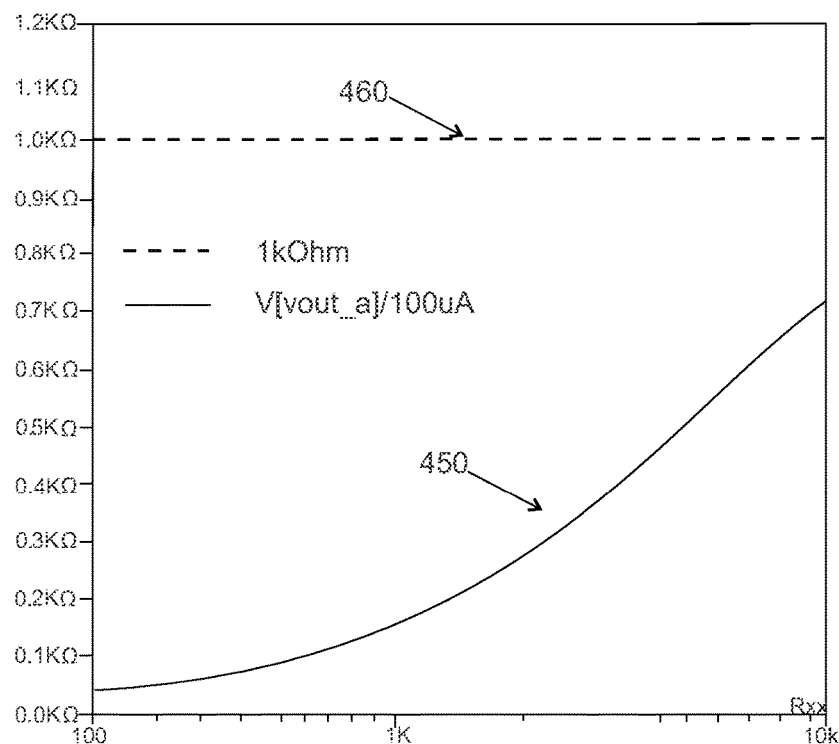

The circuit modelled in FIG. 4a-c does not have voltage feedback or compensation circuits, i.e. without any attempt to control the sensor cross talk. FIG. 4a shows the overall simulation circuit 402, with the current source 416 shown in detail in FIG. 4b. FIG. 4c shows that the sensor measurement 450 is much less than the true sensor value 460, due to the large number of parallel sneak paths between resistive elements/sensors in the array by which cross talk can take place between sensors. This arrangement would clearly be unsuitable for any practical sensor measurement.

Figure 5A:
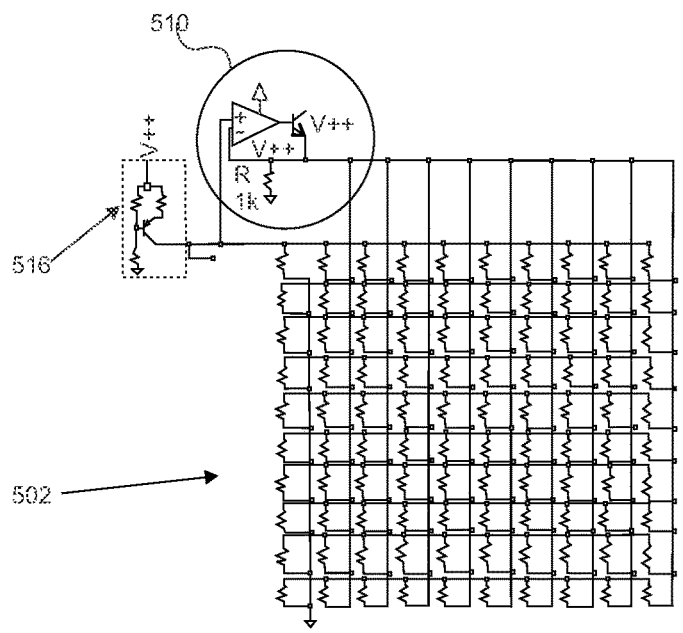
FIGS. 5a-b illustrate a simulation of the operation of an ideal sensor array circuit with voltage feedback.
Figure 5B:
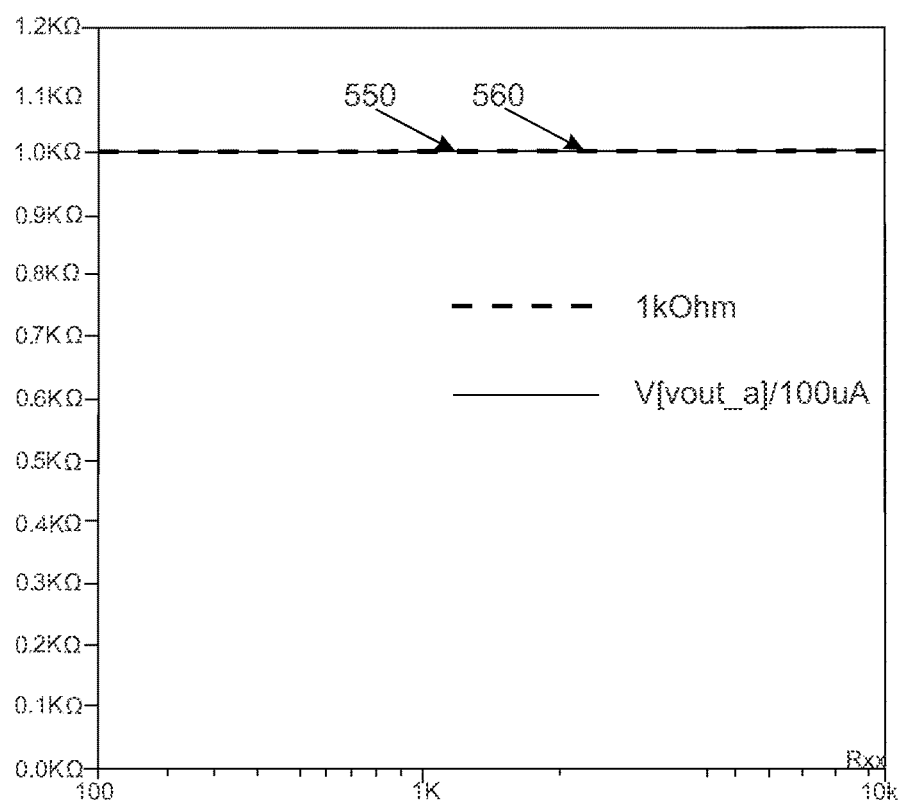

The circuit 502 modelled in FIG. 5a-b has voltage feedback 510, and the same current source 516 as the circuit of FIG. 4a, but does not have any compensation circuits. It is modelled as an ideal sensor array, that is, all switch resistances are ignored. It can be seen that using the voltage feedback method (i.e. implementing a feedback loop 510) prevents any current flowing from the drive line to the unmeasured columns (as they are at the same voltage as the drive line), and so in an ideal case the cross-talk is completely eliminated (that is, the measured trace 550 and ideal trace 560 are identical).

Figure 6A:
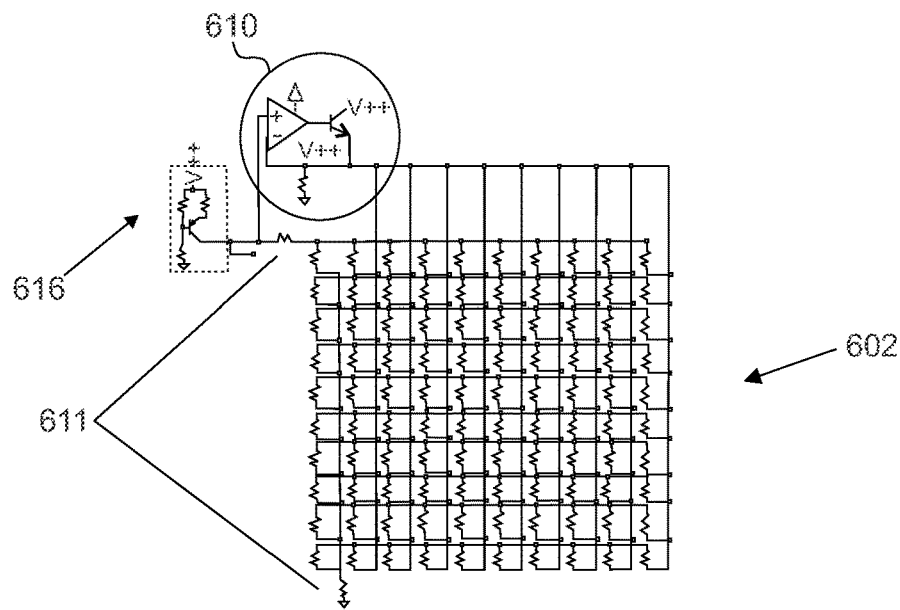
FIGS. 6a-b illustrate a simulation of the operation of a non-ideal sensor array circuit with voltage feedback.
Figure 6B:
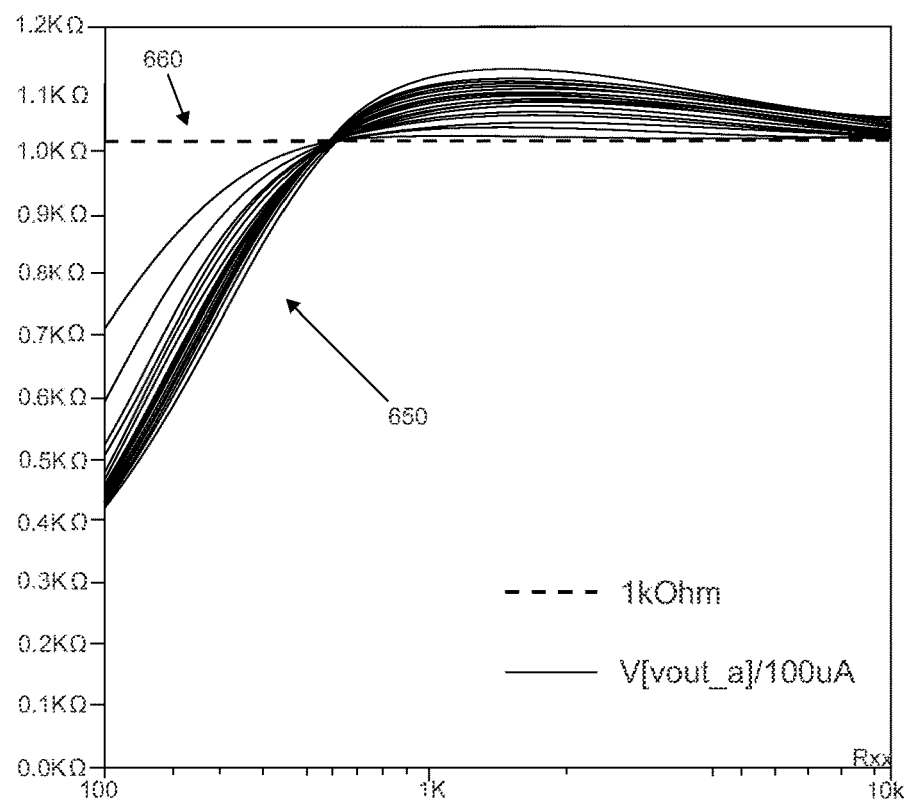

The circuit 602 modelled in FIG. 6a-b has voltage feedback 610, and the same current source 616 as the circuits of FIGS. 4a and 5a, but again does not have any compensation circuits. It is modelled as a non-ideal sensor array, by including resistors 611 to model the switches as having finite non-zero resistances. It can be seen that using the voltage feedback method alone (i.e. implementing a feedback loop 610) for non-ideal switch resistances, the results are considerably poorer than those observed in the model of FIG. 5a, even for switch resistances as low as 1Ω. Finite switch resistances from 1Ω to 10Ω have been modelled in 1Ω steps. Again the ideal trace is shown 660 alongside the ten modelled sensor measurements 650.

Figure 7A:
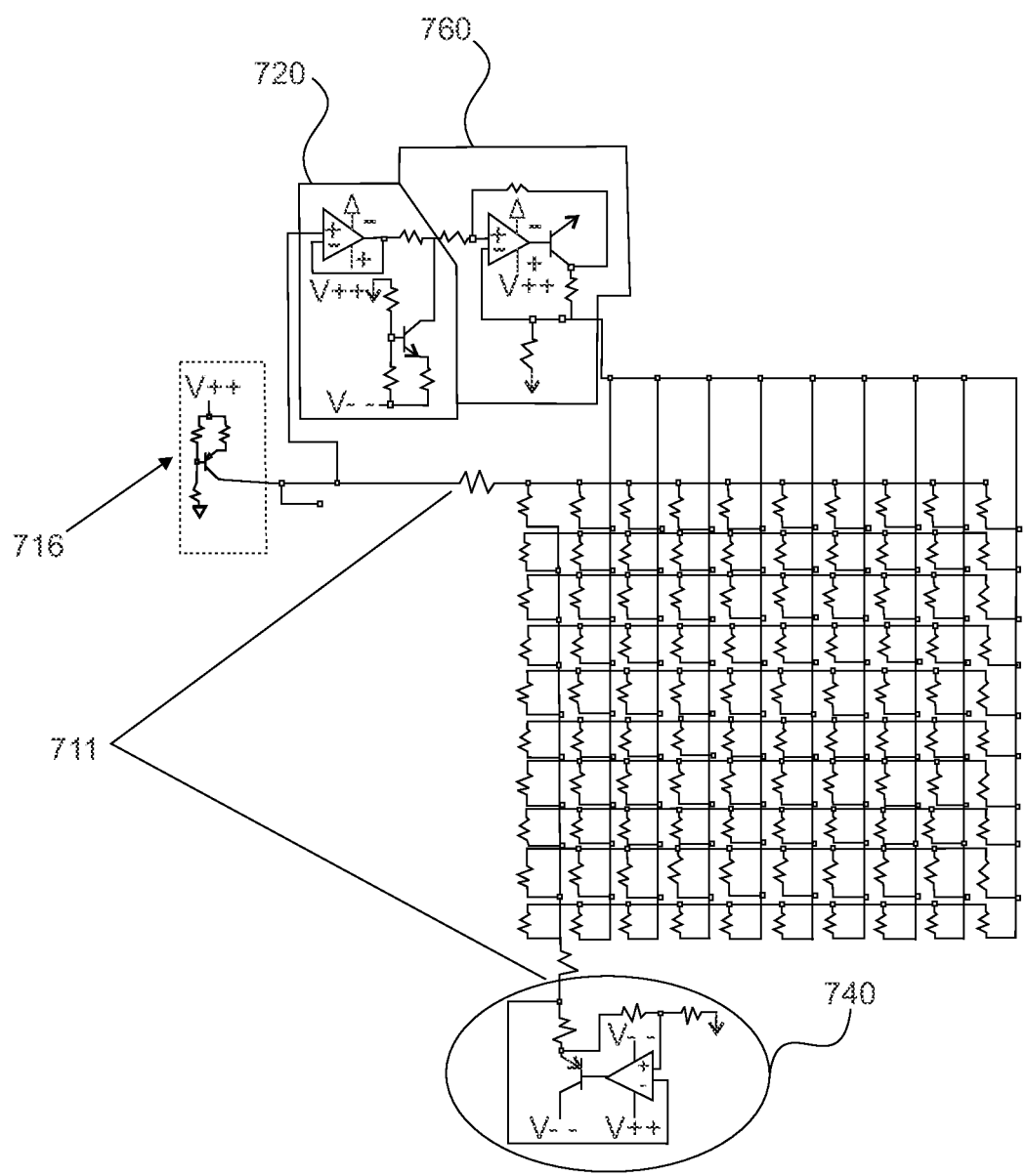
FIGS. 7a-b illustrate a simulation of the operation of a compensated sensor array circuit with voltage feedback according the examples disclosed herein.
Figure 7B:
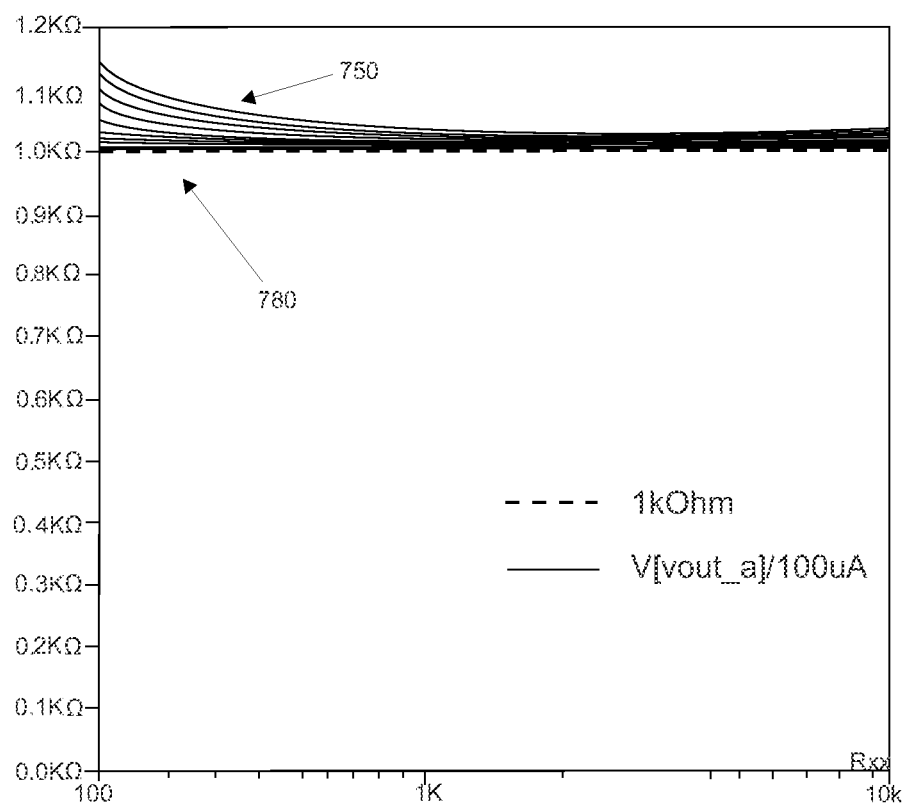

The circuit 702 modelled in FIG. 7a-b has voltage feedback, and the same current source 716 as the circuits of FIGS. 4a, 5a and 6a, but this time three compensation circuits 720, 740 and 760 are included in the model (to model the circuit of FIG. 2). The 100 μA current sink for the row selector switch compensation circuit is modelled using a NPN transistor). Finite switch resistances from 1Ω to 10Ω have again been modelled in 1Ω steps. The results 750 show that a compensated voltage feedback method as described in relation to FIG. 2, for example, is able to account for the main sources of error created by the switch resistances (by the traces 750 being considerably closer to the ideal trace 780 than other modelled methods described above). While the compensation is not perfect it is a substantial improvement over the previous circuits. Additionally the gradient of the measurements 750 is low, meaning that even if there are systematic errors present, the sensitivity of the sensor measurement to changes in the other array sensors is low, and so image artefacts from cross-talk are unlikely.

Figure 7C:
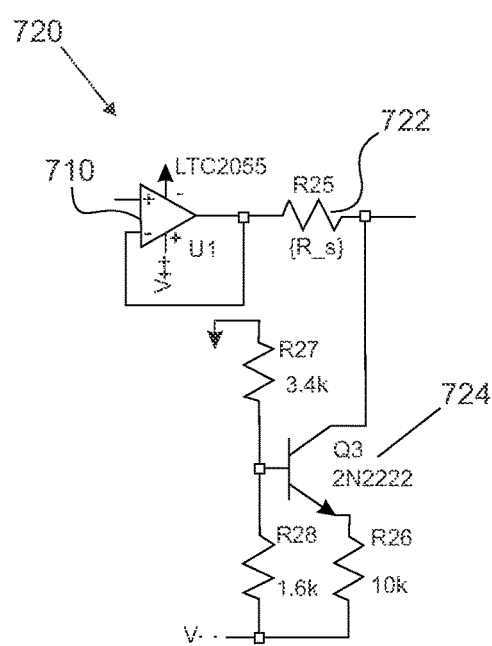
FIGS. 7c-e illustrate simulation arrangements of different compensation circuits for a voltage feedback circuit according the examples disclosed herein.

FIG. 7c shows a detailed view of the circuit model 720 used to provide a row selector switch compensation circuit. The circuit 720 includes an operational amplifier 710 to model the operational amplifier of the row selector switch compensation circuit, a resistor 722 to model the switch resistance, and a transistor 724 to model the row compensation circuit dummy switch. In FIG. 7c, U1 (710) is the operational amplifier (equivalent of 310), R25 (722) is the dummy switch (~322) and Q3 (724) is the current sink (~324).

Figure 7D:
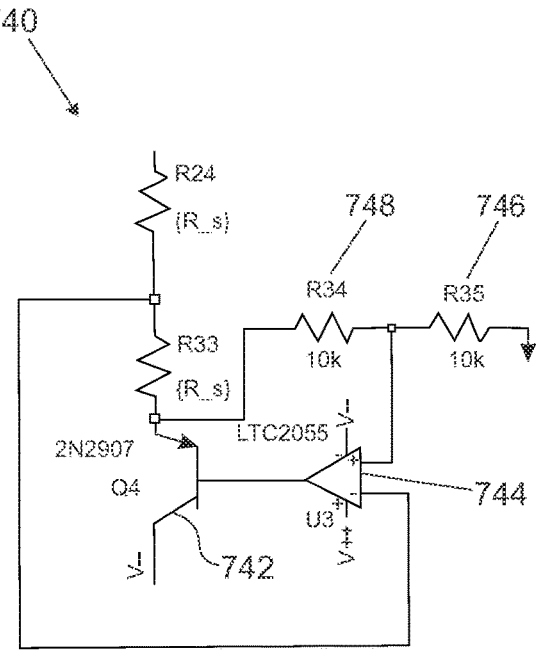

FIG. 7d shows a detailed view of the circuit model 740 used to provide a column selector switch compensation circuit. The circuit 740 includes an operational amplifier 744 to model the operational amplifier of the column selector switch compensation circuit, a first 10 kΩ resistor 748 and a second 10 kΩ resistor 746 to model the resistors $R_3$ and $R_4$ of FIG. 3b respectively, and a transistor 742 to model the column compensation circuit dummy switch. U3 and Q4 (744 and 722) in combination act as the operational amplifier (~344)—the transistor Q4 is there to increase output current drive of the amplifier. R33 is the dummy switch (~342), R34 and R35 (746 and 748) are the circuit resistors (~346 and 348).

Figure 7E:
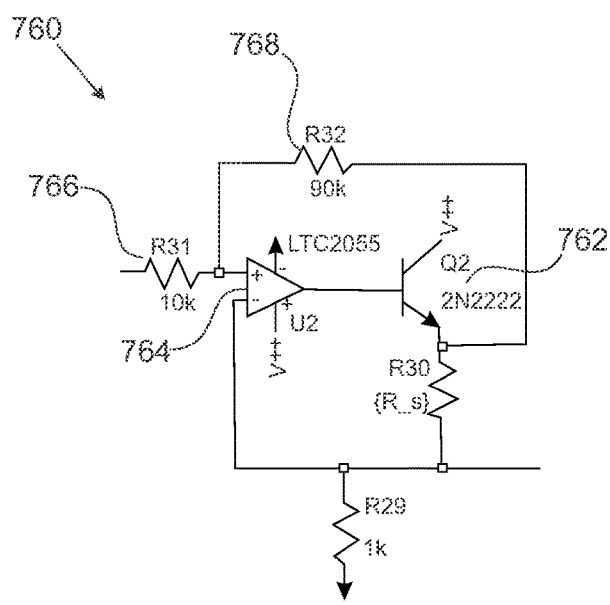

FIG. 7e shows a detailed view of the circuit model 760 used to provide a feedback column selector switch compensation circuit. The circuit 760 includes an operational amplifier 764 to model the operational amplifier of the feedback column selector switch compensation circuit, a first 90 kΩ resistor 768 and a second 10 kΩ resistor 766 to model the resistors R₁ and R₂ of FIG. 3c respectively, and a transistor 762 to model the feedback column compensation circuit dummy switch. U2 and Q2 (764 and 762) in combination act as the operational amplifier (~364)—the transistor Q2 is there to increase output current drive of the amplifier. R30 is the dummy switch (~362), R31 and R32 (766 and 768) are the circuit resistors (~366 and 368).

FIG. 8 shows the main steps 802 of a method comprising using an apparatus to detect a sensing event at a particular resistive element in a passive array of an apparatus 802, the apparatus comprising: a row selector switch configured to connect a current source to a particular row of resistive elements of the passive array; a column selector switch configured to connect a particular column of resistive elements of the passive array to ground; and a feedback column selector switch configured to connect all columns of resistive elements to a voltage source, except for the particular column connected to ground by the column selector switch; the voltage source configured to apply a voltage to the columns of resistive elements connected to the voltage source, the voltage matching a voltage dropped over the resistive element connected in circuit by the row selector switch and column selector switch/The apparatus further comprises one or more of: a row selector switch compensation circuit configured to apply a voltage across a row dummy element equal and opposite to a voltage dropped over the row selector switch; a column selector switch compensation circuit configured to apply a voltage across a column dummy element equal and opposite to a voltage dropped over the column selector switch; and a feedback column selector switch compensation circuit configured to apply a voltage across a feedback column dummy element equal and opposite to a voltage dropped over the feedback column selector switch.

FIG. 9 illustrates schematically a computer/processor readable medium 900 providing a computer program according to one embodiment. The computer program comprises computer code configured to control an apparatus as shown in FIG. 2 described above, by detecting a sensing event at a particular resistive element in the passive array by switching the one or more of the row selector switch compensation circuit, the column selector switch compensation circuit and the feedback column selector switch compensation circuit.

In this example, the computer/processor readable medium 900 is a disc such as a digital versatile disc (DVD) or a compact disc (CD). In other embodiments, the computer/processor readable medium 900 may be any medium that has been programmed in such a way as to carry out an inventive function. The computer/processor readable medium 900 may be a removable memory device such as a memory stick or memory card (SD, mini SD, micro SD or nano SD).

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
a passive array of resistive elements;
a row selector switch configured to connect a current source to a row of resistive elements of the passive array;
a column selector switch configured to connect a column of resistive elements of the passive array to ground, wherein the row selector switch and column selector switch select a resistive element in the passive array; and
a feedback column selector switch configured to connect one or more columns of resistive elements to a voltage source, except for the column connected to ground by the column selector switch;
the voltage source configured to apply a voltage to the one or more columns of resistive elements connected to the voltage source, the voltage matching a voltage dropped over the resistive element connected in a circuit formed in part by the row selector switch and column selector switch;
and one or more of:
a row selector switch compensation circuit configured to apply a voltage across a row dummy element equal and opposite to a voltage dropped over the row selector switch;
a column selector switch compensation circuit configured to apply a voltage across a column dummy element equal and opposite to a voltage dropped over the column selector switch; or
a feedback column selector switch compensation circuit configured to apply a voltage across a feedback column dummy element equal and opposite to a voltage dropped over the feedback column selector switch.

2. The apparatus of claim 1, wherein the apparatus comprises each of the row selector switch compensation circuit, the column selector switch compensation circuit and the feedback column selector switch compensation circuit.

3. The apparatus of claim 1, wherein the dummy element in one or more of the row selector switch compensation circuit, the column selector switch compensation circuit or the feedback column selector switch compensation circuit is a dummy switch configured to have comparable physical properties to the corresponding selector switch.

4. The apparatus of claim 1, wherein the apparatus comprises a current source configured to provide a current to the circuit; and wherein the row selector switch compensation circuit comprises a current sink configured to provide an equal and opposite current to the current source.

5. The apparatus of claim 1, wherein the column selector switch compensation circuit comprises:
an operational amplifier configured to apply a voltage across the column dummy element according to the current passing through the column connected to ground.

6. The apparatus of claim 5, wherein the column selector switch compensation circuit comprises:
a first resistor connected in parallel with the operational amplifier; and
a second resistor connected between an input terminal of the operational amplifier and ground; wherein:
the ratio of the resistance of the first resistor to the resistance of the second resistor is one.

7. The apparatus of claim 1, wherein the feedback column selector switch compensation circuit comprises:
an operational amplifier configured to apply a voltage across the feedback column dummy element according to the average current passing through all the columns of resistive elements connected to the voltage source except for the column connected to ground by the column selector switch.

8. The apparatus of claim 5, wherein the feedback column selector switch compensation circuit comprises:
a resistor connected in parallel with the operational amplifier; and
a second resistor connected to an input terminal of the operational amplifier; wherein:
a ratio of the resistance of the first resistor to the resistance of the second resistor corresponds to the number of columns of resistive elements minus one.

9. The apparatus of claim 1, wherein the passive array of resistive elements comprises one or more of: a sensor; a photodetector; an X-ray detector; a memristor; a piezoresistive (pressure/strain) sensor; a magneto-resistive sensor; a resistive temperature sensor (thermistor); a light dependent sensor; a resistive level sensor; a field-effect-transistor based sensor; a graphene-based sensor; a chemical sensor, or a biosensor.

10. A method comprising using an apparatus to detect a sensing event at a resistive element in a passive array of an apparatus, the apparatus comprising:
a row selector switch configured to connect a current source to a row of resistive elements of the passive array;
a column selector switch configured to connect a column of resistive elements of the passive array to ground, wherein the row selector switch and column selector switch select a resistive element in the passive array; and
a feedback column selector switch configured to connect all columns of resistive elements to a voltage source, except for the column connected to ground by the column selector switch;
the voltage source configured to apply a voltage to the one or more columns of resistive elements connected to the voltage source, the voltage matching a voltage dropped over the resistive element connected in a circuit formed in part by the row selector switch and column selector switch;
and further comprising one or more of:
a row selector switch compensation circuit configured to apply a voltage across a row dummy element equal and opposite to a voltage dropped over the row selector switch;
a column selector switch compensation circuit configured to apply a voltage across a column dummy element equal and opposite to a voltage dropped over the column selector switch; or a feedback column selector switch compensation circuit configured to apply a voltage across a feedback column dummy element equal and opposite to a voltage dropped over the feedback column selector switch.

11. The method of claim 10, wherein the apparatus comprises each of the row selector switch compensation circuit, the column selector switch compensation circuit and the feedback column selector switch compensation circuit.

12. The method of claim 10, wherein the dummy element in one or more of the row selector switch compensation circuit, the column selector switch compensation circuit or the feedback column selector switch compensation circuit is a dummy switch configured to have comparable physical properties to the corresponding selector switch.

13. The method of claim 10, wherein the apparatus comprises a current source configured to provide a current to the circuit; and wherein the row selector switch compensation circuit comprises a current sink configured to provide an equal and opposite current to the current source.

14. The method of claim 10, wherein the column selector switch compensation circuit comprises:
an operational amplifier configured to apply a voltage across the column dummy element according to the current passing through the column connected to ground.

15. The method of claim 14, wherein the column selector switch compensation circuit comprises:
a first resistor connected in parallel with the operational amplifier; and
a second resistor connected between an input terminal of the operational amplifier and ground; wherein:
the ratio of the resistance of the first resistor to the resistance of the second resistor is one.

16. The method of claim 10, wherein the feedback column selector switch compensation circuit comprises:
an operational amplifier configured to apply a voltage across the feedback column dummy element according to the average current passing through all the columns of resistive elements connected to the voltage source except for the column connected to ground by the column selector switch.

17. The method of claim 14, wherein the feedback column selector switch compensation circuit comprises:
a resistor connected in parallel with the operational amplifier; and
a second resistor connected to an input terminal of the operational amplifier; wherein:
a ratio of the resistance of the first resistor to the resistance of the second resistor corresponds to the number of columns of resistive elements minus one.

18. The method of claim 10, wherein the passive array of resistive elements comprises one or more of: a sensor; a photodetector; an X-ray detector; a memristor; a piezoresistive (pressure/strain) sensor; a magneto-resistive sensor; a resistive temperature sensor (thermistor); a light dependent sensor; a resistive level sensor; a field-effect-transistor based sensor; a graphene-based sensor; a chemical sensor, or a biosensor.

19. A computer readable medium comprising computer program code stored thereon, the computer readable medium and computer program code being configured to, when run on at least one processor, control the operation of an apparatus, the apparatus comprising:
a passive array of resistive elements;
a row selector switch configured to connect a current source to a row of resistive elements of the passive array;
a column selector switch configured to connect a column of resistive elements of the passive array to ground, wherein the row selector switch and column selector switch select a resistive element in the passive array; and
a feedback column selector switch configured to connect all columns of resistive elements to a voltage source, except for the column connected to ground by the column selector switch;
the voltage source configured to apply a voltage to the one or more columns of resistive elements connected to the voltage source, the voltage matching a voltage dropped over the resistive element connected in a circuit formed in part by the row selector switch and column selector switch;
and further comprising one or more of:
a row selector switch compensation circuit configured to apply a voltage across a row dummy element equal and opposite to a voltage dropped over the row selector switch;
a column selector switch compensation circuit configured to apply a voltage across a column dummy element equal and opposite to a voltage dropped over the column selector switch; or
a feedback column selector switch compensation circuit configured to apply a voltage across a feedback column dummy element equal and opposite to a voltage dropped over the feedback column selector switch;
the control providing for:
detecting a sensing event at a resistive element in the passive array by switching the one or more of the row selector switch compensation circuit, the column selector switch compensation circuit and the feedback column selector switch compensation circuit.

* * * * *